(12) United States Patent
Campbell et al.

(10) Patent No.: US 8,208,258 B2
(45) Date of Patent: Jun. 26, 2012

(54) SYSTEM AND METHOD FOR FACILITATING PARALLEL COOLING OF LIQUID-COOLED ELECTRONICS RACKS

(75) Inventors: Levi A. Campbell, Poughkeepsie, NY (US); Richard C. Chu, Poughkeepsie, NY (US); Michael J. Ellsworth, Jr., Poughkeepsie, NY (US); Madhusudan K. Iyengar, Pougkeepsie, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 389 days.

(21) Appl. No.: 12/556,053

(22) Filed: Sep. 9, 2009

(65) Prior Publication Data

US 2011/0056674 A1    Mar. 10, 2011

(51) Int. Cl.
*H05K 7/20* (2006.01)
(52) U.S. Cl. ........ 361/699; 361/696; 361/698; 361/701; 361/702; 165/104.33; 165/80.5; 257/714; 62/259.2
(58) Field of Classification Search .......... 361/688–689, 361/692, 696–702
See application file for complete search history.

(56) References Cited

U.S. PATENT DOCUMENTS

| | | | |
|---|---|---|---|
| 3,578,014 A | 5/1971 | Gachot | |
| 4,430,866 A | 2/1984 | Willitts | |
| 5,491,649 A | 2/1996 | Friday et al. | |
| 5,782,101 A | 7/1998 | Dennis | |
| 5,829,264 A | 11/1998 | Ishigaki et al. | |
| 6,212,895 B1 | 4/2001 | Richardson | |
| 6,574,104 B2 | 6/2003 | Patel et al. | |
| 7,012,807 B2 | 3/2006 | Chu et al. | |
| 7,088,585 B2 | 8/2006 | Chu et al. | |
| 7,106,590 B2 | 9/2006 | Chu et al. | |
| 7,143,605 B2 | 12/2006 | Rohrer et al. | |
| 7,191,954 B2 | 3/2007 | Kline | |
| 7,222,502 B2 | 5/2007 | Kobayashi et al. | |
| 7,309,209 B2 | 12/2007 | Amiot et al. | |
| 7,315,448 B1 | 1/2008 | Bash et al. | |
| 7,349,213 B2 | 3/2008 | Campbell et al. | |
| 7,385,810 B2 | 6/2008 | Chu et al. | |

(Continued)

OTHER PUBLICATIONS

Office Action for U.S. Appl. No. 12/556,066 (U.S. Patent Publication No. 2011/0060470 A1), dated Aug. 31, 2011.

(Continued)

*Primary Examiner* — Courtney Smith
(74) *Attorney, Agent, or Firm* — Dennis Jung, Esq.; Kevin P. Radigan, Esq.; Heslin Rothenberg Farley & Mesiti P.C.

(57) ABSTRACT

A cooling system and method are provided for facilitating cooling of multiple liquid-cooled electronics racks. The cooling system includes a main system coolant supply loop with a plurality of system coolant supply branch lines for facilitating supply of cooled system coolant to the electronics racks, and a main system coolant return loop with a plurality of system coolant return branch lines for facilitating return of exhausted system coolant from the electronics racks. When operational, cooled system coolant circulates through the coolant supply loop and exhausted system coolant circulates through the coolant return loop. A plurality of modular cooling units are coupled to the coolant supply loop and coolant return loop. Each modular cooling unit includes a heat exchanger to facilitate cooling of a portion of the exhausted coolant circulating through the main system coolant return loop for return as cooled system coolant to the main system coolant supply loop.

18 Claims, 10 Drawing Sheets

U.S. PATENT DOCUMENTS

| | | | |
|---|---|---|---|
| 7,392,823 | B2 | 7/2008 | Dong et al. |
| 7,418,825 | B1 | 9/2008 | Bean, Jr. |
| 7,420,808 | B2 | 9/2008 | Campbell et al. |
| 7,477,514 | B2 | 1/2009 | Campbell et al. |
| 7,531,142 | B2 | 5/2009 | Huziwara et al. |
| 7,559,207 | B2 | 7/2009 | Knight et al. |
| 7,715,194 | B2 * | 5/2010 | Brewer et al. ................. 361/699 |
| 7,895,854 | B2 | 3/2011 | Bash et al. |
| 7,903,409 | B2 | 3/2011 | Patel et al. |
| 8,018,718 | B2 * | 9/2011 | Goth et al. .................... 361/699 |
| 2002/0149909 | A1 * | 10/2002 | Konstad et al. ............... 361/687 |
| 2003/0057546 | A1 * | 3/2003 | Memory et al. ............. 257/706 |
| 2005/0115257 | A1 * | 6/2005 | Goth et al. ..................... 62/186 |
| 2005/0244280 | A1 | 11/2005 | Malone et al. |
| 2006/0180300 | A1 | 8/2006 | Lenehan et al. |
| 2007/0119570 | A1 | 5/2007 | Kuo et al. |
| 2007/0213881 | A1 | 9/2007 | Belady et al. |
| 2007/0297136 | A1 | 12/2007 | Konshak |
| 2008/0205003 | A1 * | 8/2008 | Belady ........................... 361/700 |
| 2009/0080173 | A1 | 3/2009 | Schmidt |
| 2009/0126909 | A1 * | 5/2009 | Ellsworth et al. ........ 165/104.33 |
| 2009/0126910 | A1 | 5/2009 | Campbell et al. |
| 2009/0133866 | A1 | 5/2009 | Campbell et al. |
| 2010/0032142 | A1 | 2/2010 | Copeland et al. |
| 2010/0263855 | A1 * | 10/2010 | Arimilli et al. ............... 165/288 |
| 2011/0029152 | A1 | 2/2011 | Patel et al. |
| 2011/0056225 | A1 | 3/2011 | Campbell et al. |
| 2011/0056675 | A1 | 3/2011 | Barringer et al. |
| 2011/0058637 | A1 | 3/2011 | Campbell et al. |
| 2011/0060470 | A1 | 3/2011 | Campbell et al. |

OTHER PUBLICATIONS

Campbell et al., "Condenser Structures with Fin Cavities Facilitating Vapor Condensation Cooling of Coolant", U.S. Appl. No. 12/491,287, filed Jun. 25, 2009.

Campbell et al., "Apparatus and Method for Facilitating Immersion-Cooling of an Electronic Subsystem", U.S. Appl. No. 12/256,618, filed Oct. 23, 2008.

Campbell et al., "Liquid Cooling Apparatus and Method for Cooling Blades of an Electronic System Chassis", U.S. Appl. No. 12/256,623, filed Oct. 23, 2008.

Zamanabadi et al., "Hybrid Control Challenges in Refrigeration Systems", Danfoss A/S, Denmark, Advanced Engineering—Refrigeration and Air Conditioning, EECI (2007).

* cited by examiner

SYSTEM AND METHOD FOR FACILITATING PARALLEL COOLING OF LIQUID-COOLED ELECTRONICS RACKS

BACKGROUND

The present invention relates in general to systems and methods for facilitating parallel cooling of rack-mounted assemblages of individual electronics units, such as rack-mounted computer server units.

The power dissipation of integrated circuit chips, and the modules containing the chips, continues to increase in order to achieve increases in processor performance. This trend poses a cooling challenge at both module and system level. Increased airflow rates are needed to effectively cool high power modules and to limit the temperature of the air that is exhausted into the computer center.

In many large server applications, processors along with their associated electronics (e.g., memory, disk drives, power supplies, etc.) are packaged in removable drawer configurations stacked within a rack or frame. In other cases, the electronics may be in fixed locations within the rack or frame. Typically, the components are cooled by air moving in parallel airflow paths, usually front-to-back, impelled by one or more air moving devices (e.g., fans or blowers). In some cases it may be possible to handle increased power dissipation within a single drawer by providing greater airflow, through the use of a more powerful air moving device or by increasing the rotational speed (i.e., RPMs) of an existing air moving device. However, this approach is becoming problematic at the rack level in the context of a computer installation (i.e., data center).

The sensible heat load carried by the air exiting the rack is stressing the availability of the room air-conditioning to effectively handle the load. This is especially true for large installations with "server farms" or large banks of computer racks close together. In such installations, liquid cooling (e.g., water cooling) is an attractive technology to manage the higher heat fluxes. The liquid absorbs the heat dissipated by the components/modules in an efficient manner. Typically, the heat is ultimately transferred from the liquid to an outside environment, whether air or liquid cooled.

BRIEF SUMMARY

In one aspect, the shortcomings of the prior art are overcome and additional advantages are provided through the provision of a cooling system for facilitating cooling of a plurality of liquid-cooled electronics systems, such as a plurality of liquid-cooled electronics racks. The cooling system includes a system coolant supply manifold, a system coolant return manifold and a plurality of modular cooling units. The system coolant supply manifold includes a main system coolant supply loop and at least one system coolant supply branch line extending therefrom and in fluid communication therewith for facilitating supply of cooled system coolant to the plurality of liquid-cooled electronics systems, wherein when operational, cooled system coolant circulates through the main system coolant supply loop. The system coolant return manifold includes a main system coolant return loop and at least one system coolant return branch line extending thereto and in fluid communication therewith for facilitating return of exhausted system coolant from the plurality of liquid-cooled electronics systems. When operational, exhausted system coolant circulates through the main system coolant return loop. Each modular cooling unit of the plurality of modular cooling units is coupled in fluid communication with the main system coolant supply loop and the main system coolant return loop, and includes a liquid-to-liquid heat exchanger comprising a first coolant path and a second coolant path. The first coolant path is in fluid communication with the main system coolant return loop and the main system coolant supply loop to facilitate passing a portion of exhausted system coolant from the main system coolant return loop through the liquid-to-liquid heat exchanger. The second coolant path is coupled in fluid communication with a facility coolant supply line and a facility coolant return line to facilitate passing chilled facility coolant through the liquid-to-liquid heat exchanger for cooling exhausted system coolant passing through the first coolant path of the liquid-to-liquid heat exchanger for recirculation thereof to the plurality of liquid-cooled electronics systems as cooled system coolant via the main system coolant supply loop.

In another aspect, a data center is provided which includes a plurality of liquid-cooled electronics racks and a cooling system for facilitating liquid cooling of the plurality of liquid-cooled electronics racks. The cooling system includes a system coolant supply manifold, a system coolant return manifold and a plurality of modular cooling units. The system coolant supply manifold includes a main system coolant supply loop and a plurality of system coolant supply branch lines extending therefrom and in fluid communication therewith for facilitating supply of cooled system coolant to the plurality of liquid-cooled electronics racks, wherein when operational, cooled system coolant circulates through the main system coolant supply loop. The system coolant return manifold includes a main system coolant return loop and a plurality of system coolant return branch lines extending thereto and in fluid communication therewith for facilitating return of exhausted system coolant from the plurality of liquid-cooled electronics racks. When operational, exhausted system coolant circulates through the main system coolant return loop. Each modular cooling unit of the plurality of modular cooling units is coupled in fluid communication with the main system coolant supply loop and the main system coolant return loop, and includes a liquid-to-liquid heat exchanger comprising a first coolant path and a second coolant path. The first coolant path is in fluid communication with the main system coolant return loop and the main system coolant supply loop to facilitate passing of a portion of exhausted system coolant from the main system coolant return loop through the liquid-to-liquid heat exchanger. The second coolant path is coupled in fluid communication with a facility coolant supply line and a facility coolant return line to facilitate passing of chilled facility coolant through the liquid-to-liquid heat exchanger for cooling exhausted system coolant passing through the first coolant path of the liquid-to-liquid heat exchanger for recirculation thereof to the plurality of liquid-cooled electronics racks as cooled system coolant via the main system coolant supply loop.

In a further aspect, a method of facilitating parallel cooling of a plurality of liquid-cooled electronics systems is provided. The method includes: providing a system coolant supply manifold, the system coolant supply manifold comprising a main system coolant supply loop and at least one system coolant supply branch line extending therefrom and in fluid communication therewith for facilitating supply of cooled system coolant to the plurality of liquid-cooled electronics systems, wherein when operational, cooled system coolant circulates through the main system coolant supply loop; providing a system coolant return manifold, the system coolant return manifold comprising a main system coolant return loop and at least one system coolant return branch line extending thereto and in fluid communication therewith for facilitating return of exhausted system coolant from the plurality of liquid-cooled electronics systems, wherein when operational, exhausted system coolant circulates through the main system coolant return loop; and providing a plurality of modular cooling units each coupled in fluid communication with the main system coolant supply loop and the main system coolant return loop, and each modular cooling unit comprising a liquid-to-liquid heat exchanger comprising a first coolant path and a second coolant path, wherein the first coolant path is in fluid communication with the main system coolant return loop and the main system coolant supply loop to facilitate passing a portion of exhausted system coolant from the main system coolant return loop through the liquid-to-liquid heat exchanger, and the second coolant path is coupled in fluid communication with a facility coolant supply line and a facility coolant return line to facilitate passing chilled facility coolant through the liquid-to-liquid heat exchanger for cooling exhausted system coolant passing through the first coolant path of the liquid-to-liquid heat exchanger for recirculation thereof to the plurality of liquid-cooled electronics systems as cooled system coolant via the main system coolant supply loop.

Further, additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

Figure 1:
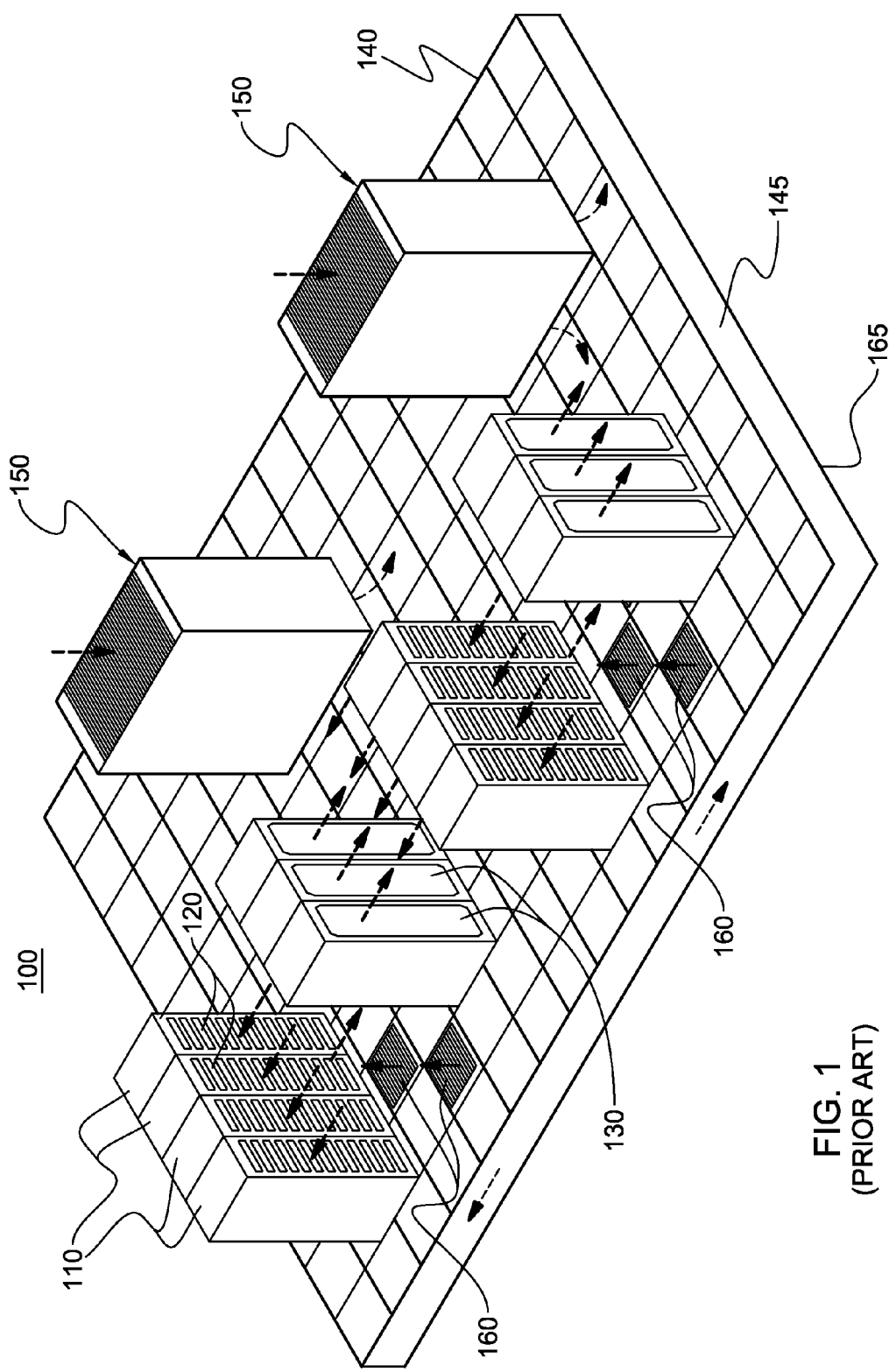
FIG. 1 depicts one embodiment of a conventional raised floor layout of an air-cooled data center.

As used herein, the terms "electronics rack", "rack-mounted electronic equipment", and "rack unit" are used interchangeably, and unless otherwise specified include any housing, frame, rack, compartment, blade server system, etc., having one or more heat generating components of a computer system or electronics system, and may be, for example, a stand alone computer processor having high, mid or low end processing capability. In one embodiment, an electronics rack may comprise multiple electronics subsystems, each having one or more heat generating components disposed therein requiring cooling. "Electronics subsystem" refers to any sub-housing, blade, book, drawer, node, compartment, etc., having one or more heat generating electronic components disposed therein. Each electronics subsystem of an electronics rack may be movable or fixed relative to the electronics rack, with the rack-mounted electronics drawers of a multi-drawer rack unit and blades of a blade center system being two examples of subsystems of an electronics rack to be cooled.

"Electronic component" refers to any heat generating electronic component of, for example, a computer system or other electronics unit requiring cooling. By way of example, an electronic component may comprise one or more integrated circuit dies and/or other electronic devices to be cooled, including one or more processor dies, memory dies and memory support dies. As a further example, the electronic component may comprise one or more bare dies or one or more packaged dies disposed on a common carrier. As used herein, "primary heat generating component" refers to a primary heat generating electronic component within an electronics subsystem, while "secondary heat generating component" refers to an electronic component of the electronics subsystem generating less heat than the primary heat generating component to be cooled. "Primary heat generating die" refers, for example, to a primary heat generating die or chip within a heat generating electronic component comprising primary and secondary heat generating dies (with a processor die being one example). "Secondary heat generating die" refers to a die of a multi-die electronic component generating less heat than the primary heat generating die thereof (with memory dies and memory support dies being examples of secondary dies to be cooled). As one example, a heat generating electronic component could comprise multiple primary heat generating bare dies and multiple secondary heat generating dies on a common carrier. Further, unless otherwise specified herein, the term "liquid-cooled cold plate" refers to any conventional thermally conductive structure having a plurality of channels or passageways formed therein for flowing of liquid coolant therethrough. In addition, "metallurgically bonded" refers generally herein to two components being welded, brazed or soldered together by any means.

As used herein, "air-to-liquid heat exchange assembly" means any heat exchange mechanism characterized as described herein through which liquid coolant can circulate; and includes, one or more discrete air-to-liquid heat exchangers coupled either in series or in parallel. An air-to-liquid heat exchanger may comprise, for example, one or more coolant flow paths, formed of thermally conductive tubing (such as copper or other tubing) in thermal or mechanical contact with a plurality of air-cooled cooling fins. Size, configuration and construction of the air-to-liquid heat exchange assembly and/or air-to-liquid heat exchanger thereof can vary without departing from the scope of the invention disclosed herein. A "liquid-to-liquid heat exchanger" may comprise, for example, two or more coolant flow paths, formed of thermally conductive tubing (such as copper or other tubing) in thermal communication with each other. Size, configuration and construction of the liquid-to-liquid heat exchanger can vary without departing from the scope of the invention disclosed herein. Further, "data center" refers to a computer installation containing one or more electronics racks to be cooled. As a specific example, a data center may include one or more rows of rack-mounted computing units, such as server units.

One example of facility coolant and system coolant is water. However, the concepts disclosed herein are readily adapted to use with other types of coolant on the facility side and/or on the system side. For example, one or more of the coolants may comprise a brine, a fluorocarbon liquid, a liquid metal, or other similar coolant, or refrigerant, while still maintaining the advantages and unique features of the present invention.

Reference is made below to the drawings (which are not drawn to scale to facilitate understanding of the invention), wherein the same reference numbers used throughout different figures designate the same or similar components.

FIG. 1 depicts a raised floor layout of an air cooled data center 100 typical in the prior art, wherein multiple electronics racks 110 are disposed in one or more rows. A data center such as depicted in FIG. 1 may house several hundred, or even several thousand microprocessors. In the arrangement illustrated, chilled air enters the computer room via perforated floor tiles 160 from a supply air plenum 145 defined between the raised floor 140 and a base or sub-floor 165 of the room. Cooled air is taken in through louvered covers at air inlet sides 120 of the electronics racks and expelled through the back (i.e., air outlet sides 130) of the electronics racks. Each electronics rack 110 may have one or more air moving devices (e.g., fans or blowers) to provide forced inlet-to-outlet airflow to cool the electronic devices within the subsystem(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within the data center 100. Room air is taken into each air conditioning unit 150 near an upper portion thereof. This room air may comprise in part exhausted air from the "hot" aisles of the computer installation defined, for example, by opposing air outlet sides 130 of the electronics racks 110.

Due to the ever-increasing airflow requirements through electronics racks, and the limits of air distribution within the typical data center installation, liquid-based cooling is being combined with the conventional air-cooling. FIGS. 2-6 illustrate one embodiment of a data center implementation employing a liquid-based cooling system with one or more cold plates coupled to high heat-generating electronic devices disposed within the electronics racks.

Figure 2:
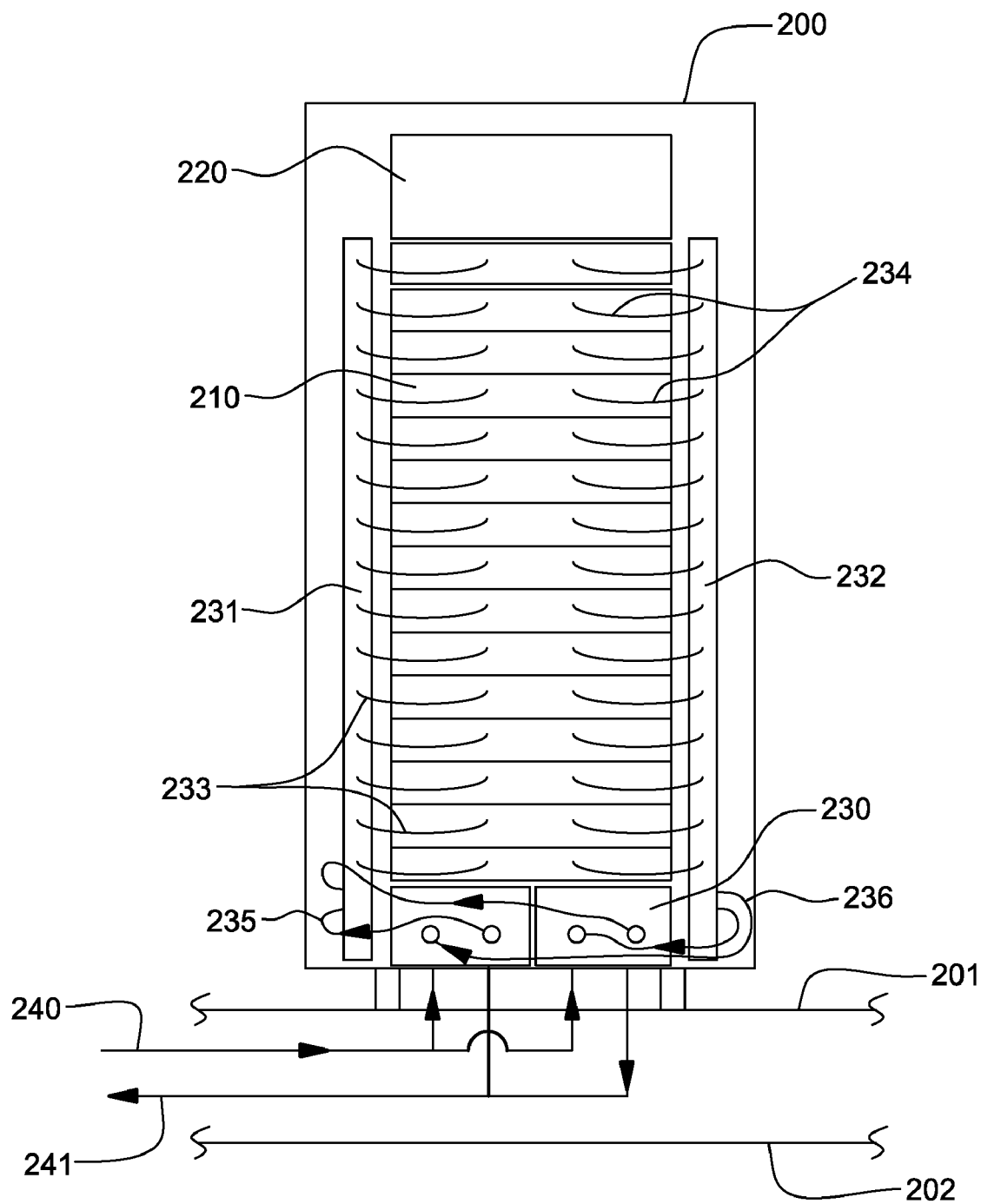
FIG. 2 is a front elevational view of one embodiment of a liquid-cooled electronics rack comprising multiple liquid electronics subsystems, in accordance with one aspect of the present invention.

FIG. 2 depicts one embodiment of a liquid-cooled electronics rack 200. As illustrated, liquid-cooled electronics rack 200 comprises a plurality of electronics subsystems 210, which may be processor or server nodes. A bulk power regulator 220 is shown disposed at an upper portion of liquid-cooled electronics rack 200, and two coolant conditioning units (CCUs) 230 are disposed in a lower portion of the liquid-cooled electronics rack. In the embodiments described herein, the coolant is assumed to be water or an aqueous-based solution (by way of example only).

In addition to CCUs 230, the cooling system includes a system water supply manifold 231, a system water return manifold 232, and manifold-to-node fluid connect hoses 233 coupling system water supply manifold 231 to electronics subsystems 210, and node-to-manifold fluid connect hoses 234 coupling the individual electronics subsystems 210 to system water return manifold 232. Each CCU 230 is in fluid communication with system water supply manifold 231 via a respective system water supply hose 235, and each CCU 230 is in fluid communication with system water return manifold 232 via a respective system water return hose 236.

As illustrated, the heat load of the electronics subsystems is transferred from the system water to cooler facility water supplied by facility water supply line 240 and facility water return line 241 disposed, in the illustrated embodiment, in the space between a raised floor 201 and a base floor 202.

Figure 3:
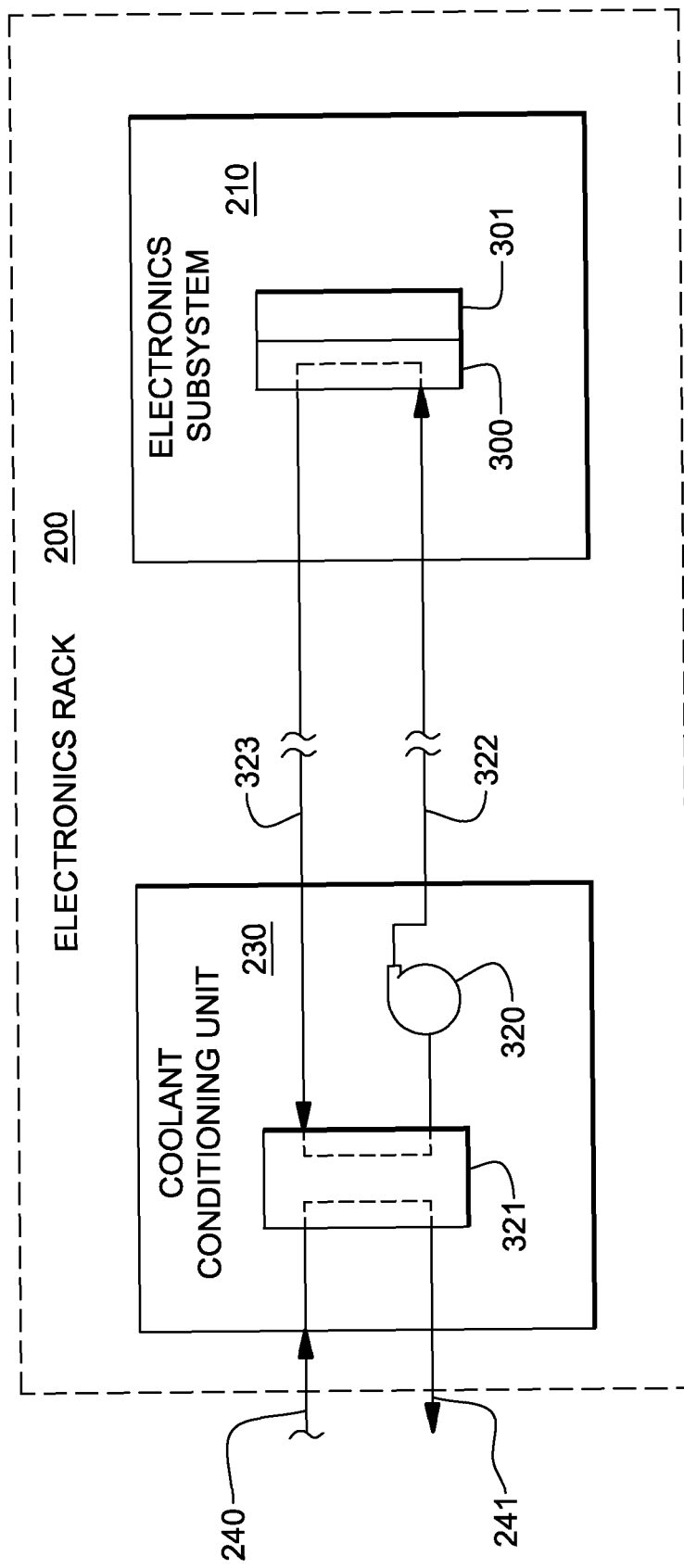
FIG. 3 is a schematic of one embodiment of an electronics rack, wherein an electronics module is liquid-cooled by system coolant provided by one or more coolant conditioning units disposed within the electronics rack, in accordance with an aspect of the present invention.

FIG. 3 schematically illustrates operation of the cooling system of FIG. 2, wherein a liquid-cooled cold plate 300 is shown coupled to an electronics module 301 of an electronics subsystem 210 within the liquid-cooled electronics rack 200. Heat is removed from electronics module 301 via the system coolant circulated via pump 320 through cold plate 300 within the system coolant loop defined by liquid-to-liquid heat exchanger 321 of coolant conditioning unit 230, lines 322, 323 and cold plate 300. The system coolant loop and coolant conditioning unit are designed to provide coolant of a controlled temperature and pressure, as well as controlled chemistry and cleanliness to the electronics module(s). Furthermore, the system coolant is physically separate from the less controlled facility coolant in lines 240, 241, to which heat is ultimately transferred.

Figure 4:
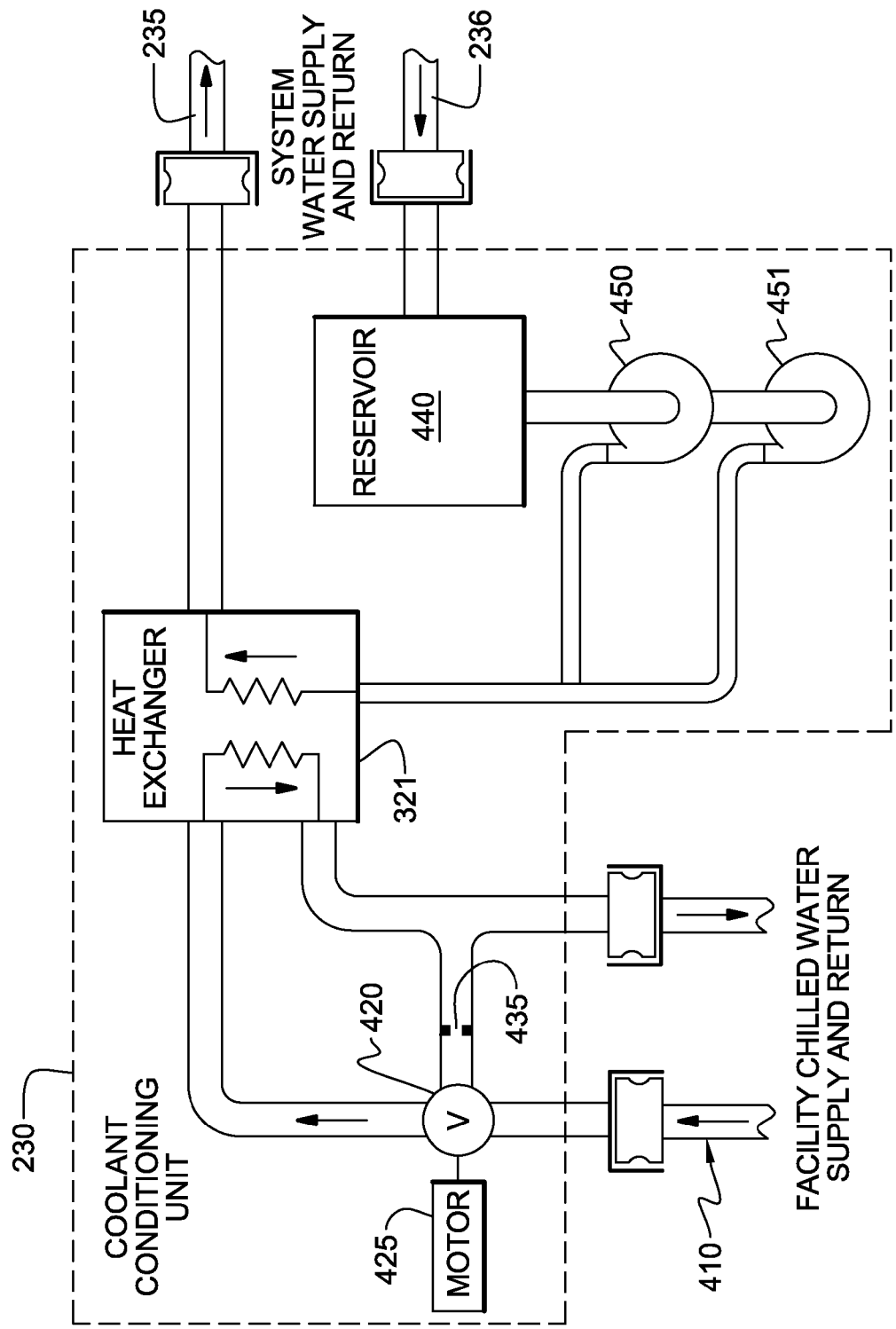
FIG. 4 is a schematic of one embodiment of a coolant conditioning unit disposed within a liquid-cooled electronics rack, in accordance with one aspect of the present invention.

FIG. 4 depicts a more detailed embodiment of a coolant conditioning unit 230. As shown in FIG. 4, coolant conditioning unit 230 includes a first cooling loop wherein building chilled, facility coolant is supplied 410 and passes through a control valve 420 driven by a motor 425. Valve 420 determines an amount of facility coolant to be passed through heat exchanger 321, with a portion of the facility coolant possibly being returned directly via a bypass orifice 435. The coolant conditioning unit further includes a second cooling loop with a reservoir tank 440 from which system coolant is pumped, either by pump 450 or pump 451, into the heat exchanger 321 for conditioning and output thereof, as cooled system coolant to the electronics rack to be cooled. The cooled system coolant is supplied to the system water supply manifold and system water return manifold of the liquid-cooled electronics rack via the system water supply hose 235 and system water return hose 236.

Figure 5:
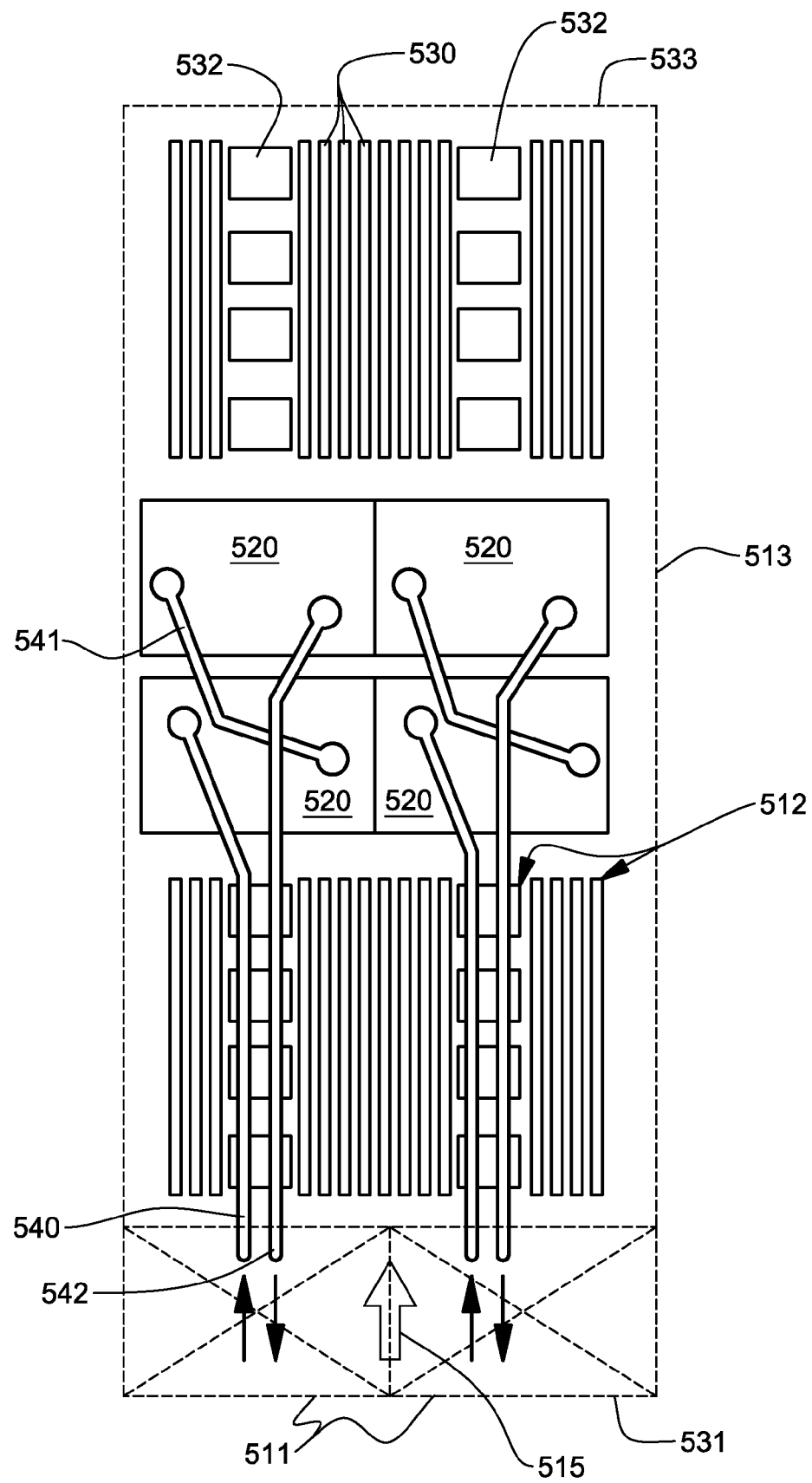
FIG. 5 is a plan view of one embodiment of an electronics subsystem layout illustrating an air and liquid cooling system for cooling components of the electronics subsystem, in accordance with an aspect of the present invention.

FIG. 5 depicts one embodiment of an electronics subsystem 513 component layout wherein one or more air moving devices 511 provide forced air flow 515 to cool multiple components 512 within electronics subsystem 513. Cool air is taken in through a front 531 and exhausted out a back 533 of the drawer. The multiple components to be cooled include multiple processor modules to which liquid-cooled cold plates 520 (of a liquid-based cooling system) are coupled, as well as multiple arrays of memory modules 530 (e.g., dual in-line memory modules (DIMMs)) and multiple rows of memory support modules 532 (e.g., DIMM control modules) to which air-cooled heat sinks are coupled. In the embodiment illustrated, memory modules 530 and the memory support modules 532 are partially arrayed near front 531 of electronics subsystem 513, and partially arrayed near back 533 of electronics subsystem 513. Also, in the embodiment of FIG. 5, memory modules 530 and the memory support modules 532 are cooled by air flow 515 across the electronics subsystem.

The illustrated liquid-based cooling system further includes multiple coolant-carrying tubes connected to and in fluid communication with liquid-cooled cold plates 520. The coolant-carrying tubes comprise sets of coolant-carrying tubes, with each set including (for example) a coolant supply tube 540, a bridge tube 541 and a coolant return tube 542. In this example, each set of tubes provides liquid coolant to a series-connected pair of cold plates 520 (coupled to a pair of processor modules). Coolant flows into a first cold plate of each pair via the coolant supply tube 540 and from the first cold plate to a second cold plate of the pair via bridge tube or line 541, which may or may not be thermally conductive. From the second cold plate of the pair, coolant is returned through the respective coolant return tube 542.

Figure 6:
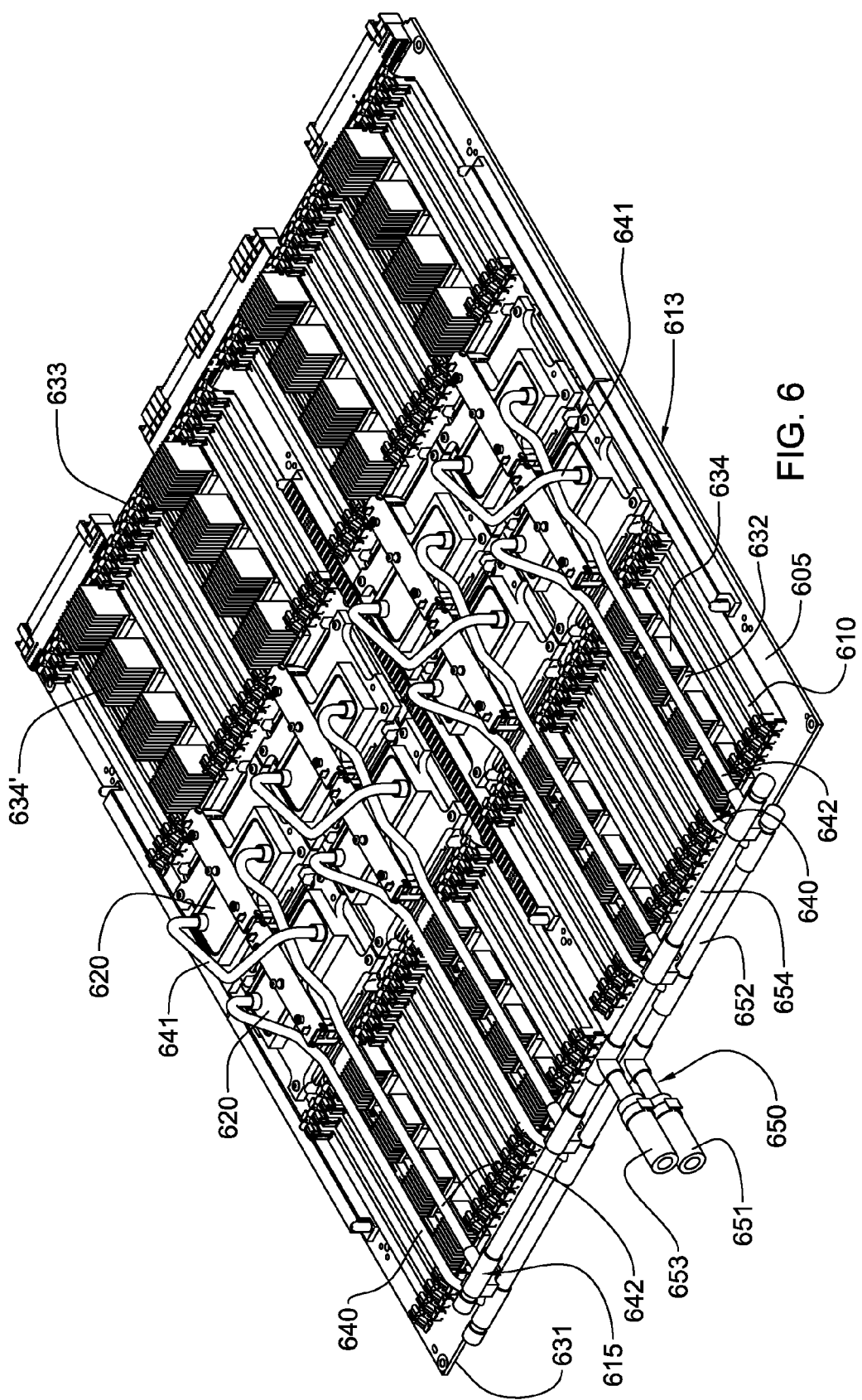
FIG. 6 depicts one detailed embodiment of a partially-assembled electronics subsystem layout, wherein the electronics subsystem includes eight heat-generating electronics components to be actively cooled, each having a respective liquid-cooled cold plate of a liquid-based cooling system coupled thereto, in accordance with an aspect of the present invention.

FIG. 6 depicts in greater detail an alternate electronics drawer layout comprising eight processor modules, each having a respective liquid-cooled cold plate of a liquid-based cooling system coupled thereto. The liquid-based cooling system is shown to further include associated coolant-carrying tubes for facilitating passage of liquid coolant through the liquid-cooled cold plates and a header subassembly to facilitate distribution of liquid coolant to and return of liquid coolant from the liquid-cooled cold plates. By way of specific example, the liquid coolant passing through the liquid-based cooling subsystem is chilled water.

As noted, various liquid coolants significantly outperform air in the task of removing heat from heat generating electronic components of an electronics system, and thereby more effectively maintain the components at a desireable temperature for enhanced reliability and peak performance. As liquid-based cooling systems are designed and deployed, it is advantageous to architect systems which maximize reliability and minimize the potential for leaks while meeting all other mechanical, electrical and chemical requirements of a given electronics system implementation. These more robust cooling systems have unique problems in their assembly and implementation. For example, one assembly solution is to utilize multiple fittings within the electronics system, and use flexible plastic or rubber tubing to connect headers, cold plates, pumps and other components. However, such a solution may not meet a given customer's specifications and need for reliability.

Thus, presented herein in one aspect is a robust and reliable liquid-based cooling system specially preconfigured and prefabricated as a monolithic structure for positioning within a particular electronics drawer.

FIG. 6 is an isometric view of one embodiment of an electronics drawer and monolithic cooling system, in accordance with an aspect of the present invention. The depicted planar server assembly includes a multi-layer printed circuit board to which memory DIMM sockets and various electronic components to be cooled are attached both physically and electrically. In the cooling system depicted, a supply header is provided to distribute liquid coolant from a single inlet to multiple parallel coolant flow paths and a return header collects exhausted coolant from the multiple parallel coolant flow paths into a single outlet. Each parallel coolant flow path includes one or more cold plates in series flow arrangement to cool one or more electronic components to which the cold plates are mechanically and thermally coupled. The number of parallel paths and the number of series-connected liquid-cooled cold plates depends, for example on the desired device temperature, available coolant temperature and coolant flow rate, and the total heat load being dissipated from each electronic component.

More particularly, FIG. 6 depicts a partially assembled electronics system 613 and an assembled liquid-based cooling system 615 coupled to primary heat generating components (e.g., including processor dies) to be cooled. In this embodiment, the electronics system is configured for (or as) an electronics drawer of an electronics rack, and includes, by way of example, a support substrate or planar board 605, a plurality of memory module sockets 610 (with the memory modules (e.g., dual in-line memory modules) not shown), multiple rows of memory support modules 632 (each having coupled thereto an air-cooled heat sink 634), and multiple processor modules (not shown) disposed below the liquid-cooled cold plates 620 of the liquid-based cooling system 615.

In addition to liquid-cooled cold plates 620, liquid-based cooling system 615 includes multiple coolant-carrying tubes, including coolant supply tubes 640 and coolant return tubes 642 in fluid communication with respective liquid-cooled cold plates 620. The coolant-carrying tubes 640, 642 are also connected to a header (or manifold) subassembly 650 which facilitates distribution of liquid coolant to the coolant supply tubes and return of liquid coolant from the coolant return tubes 642. In this embodiment, the air-cooled heat sinks 634 coupled to memory support modules 632 closer to front 631 of electronics drawer 613 are shorter in height than the air-cooled heat sinks 634' coupled to memory support modules 632 near back 633 of electronics drawer 613. This size difference is to accommodate the coolant-carrying tubes 640, 642 since, in this embodiment, the header subassembly 650 is at the front 631 of the electronics drawer and the multiple liquid-cooled cold plates 620 are in the middle of the drawer.

Liquid-based cooling system 615 comprises a pre-configured monolithic structure which includes multiple (pre-assembled) liquid-cooled cold plates 620 configured and disposed in spaced relation to engage respective heat generating electronic components. Each liquid-cooled cold plate 620 includes, in this embodiment, a liquid coolant inlet and a liquid coolant outlet, as well as an attachment subassembly (i.e., a cold plate/load arm assembly). Each attachment subassembly is employed to couple its respective liquid-cooled cold plate 620 to the associated electronic component to form the cold plate and electronic component assemblies. Alignment openings (i.e., thru-holes) are provided on the sides of the cold plate to receive alignment pins or positioning dowels during the assembly process. Additionally, connectors (or guide pins) are included within attachment subassembly which facilitate use of the attachment assembly.

As shown in FIG. 6, header subassembly 650 includes two liquid manifolds, i.e., a coolant supply header 652 and a coolant return header 654, which in one embodiment, are coupled together via supporting brackets. In the monolithic cooling structure of FIG. 6, the coolant supply header 652 is metallurgically bonded in fluid communication to each coolant supply tube 640, while the coolant return header 654 is metallurgically bonded in fluid communication to each coolant return tube 652. A single coolant inlet 651 and a single coolant outlet 653 extend from the header subassembly for coupling to the electronics rack's coolant supply and return manifolds (not shown).

FIG. 6 also depicts one embodiment of the pre-configured, coolant-carrying tubes. In addition to coolant supply tubes 640 and coolant return tubes 642, bridge tubes or lines 641 are provided for coupling, for example, a liquid coolant outlet of one liquid-cooled cold plate to the liquid coolant inlet of another liquid-cooled cold plate to connect in series fluid flow the cold plates, with the pair of cold plates receiving and returning liquid coolant via a respective set of coolant supply and return tubes. In one embodiment, the coolant supply tubes 640, bridge tubes 641 and coolant return tubes 642 are each pre-configured, semi-rigid tubes formed of a thermally conductive material, such as copper or aluminum, and the tubes are respectively brazed, soldered or welded in a fluid-tight manner to the header subassembly and/or the liquid-cooled cold plates. The tubes are pre-configured for a particular electronics system to facilitate installation of the monolithic structure in engaging relation with the electronics system.

The above-described liquid cooling approach of FIGS. 2-6 is an effective solution for circulating water through liquid-cooled cold plates attached to heat-generating circuit modules (or components). An example of the efficacy of this approach is the IBM Power 575™ system offered by International Business Machines Corporation, Armonk, N.Y. In the embodiment of FIGS. 2-6, one or more coolant conditioning units containing a pump and, for example, a water-to-water heat exchanger, are disposed within each electronics rack. As explained above, heat load carried by the system coolant circulating through the liquid-cooled components in the liquid-cooled electronics rack is rejected to facility chilled water passing through the second coolant path through the active water-to-water heat exchangers within the coolant conditioning units disposed within the rack units.

Figure 7:
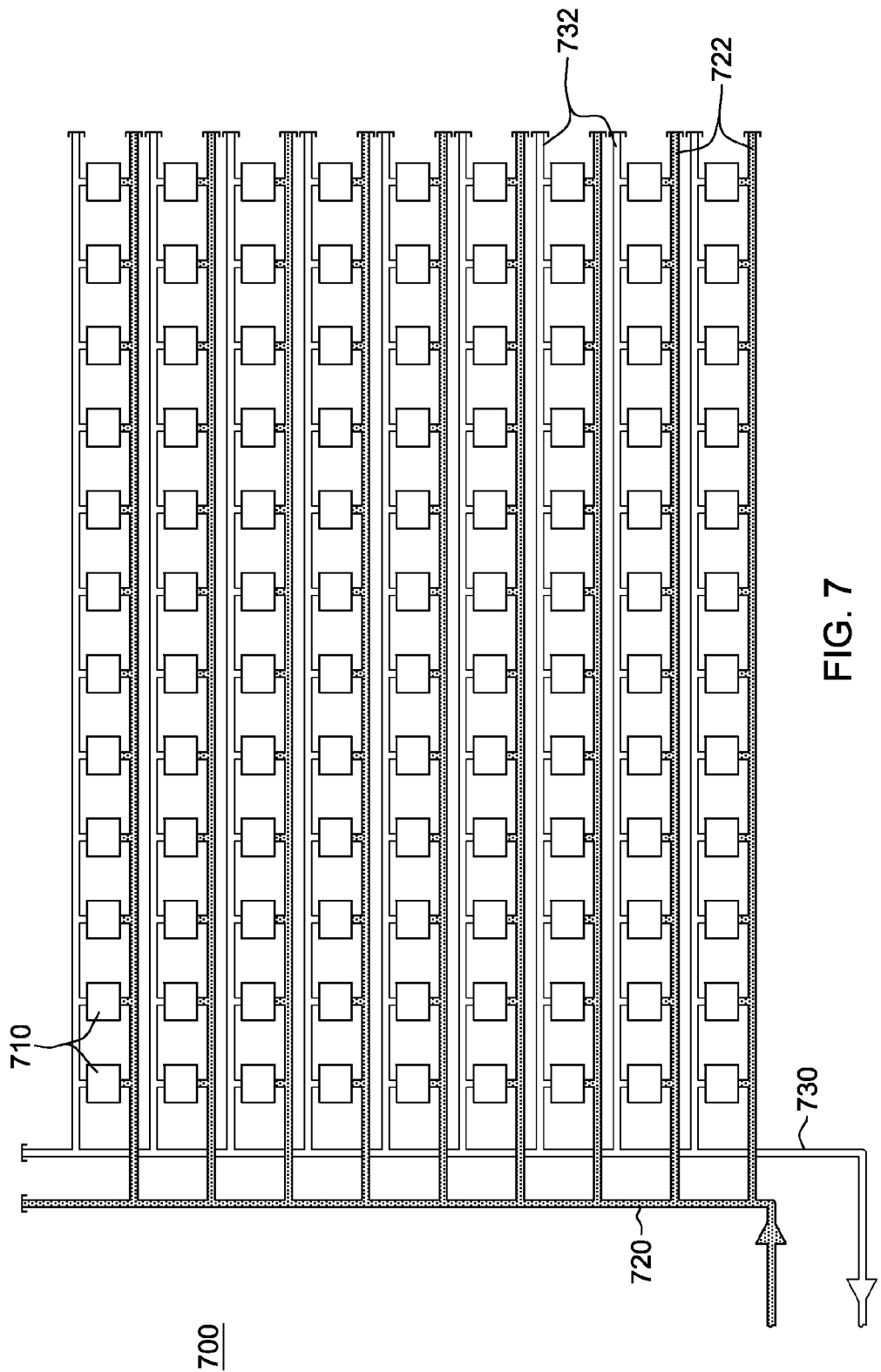
FIG. 7 is a schematic of one embodiment of a facility coolant delivery system for a data center comprising a plurality of liquid-cooled electronics racks such as depicted in FIG. 2, in accordance with an aspect of the present invention.

FIG. 7 illustrates one embodiment of a data center 700, employing a plurality of liquid-cooled electronics racks 710, such as those described above in connection with FIGS. 2-6. In this data center, a facility coolant delivery approach is illustrated which includes a main facility coolant supply line 720 having a plurality of facility coolant supply branch lines 722 extending therefrom in fluid communication with the plurality of liquid-cooled electronics racks 710 to facilitate passage of chilled facility coolant through the coolant conditioning units (CCUs) within the liquid-cooled electronics racks (as described above). A main facility coolant return line 730 similarly has a plurality of facility coolant return branch lines 732 extending thereto from the plurality of liquid-cooled electronics racks 710. Together, the main facility coolant supply and return lines 720, 730 and facility coolant supply and return branch lines 722, 732 facilitate the flow of facility coolant through the coolant conditioning units of the liquid-cooled electronics racks as described above in connection with FIGS. 2-4.

Although the cooling approach described above works well, for installations requiring larger numbers of electronics racks (for example, 20, 30 or more), a more centralized cooling approach with a smaller number of coolant pumps may be more cost effective. Also, as power consumed increases, electronics rack heat dissipation grows, and greater liquid coolant flow rates may be required, which would necessitate larger pumps within the racks. The installation of much larger pumps within the electronics racks is problematic, and even if possible, would take up valuable space that could otherwise be utilized to house additional computing nodes. In addition, supplying facility chilled water directly to the electronics racks within the data center makes it necessary to impose more stringent water quality and cleanliness requirements on the customer's facility water.

Figure 8:
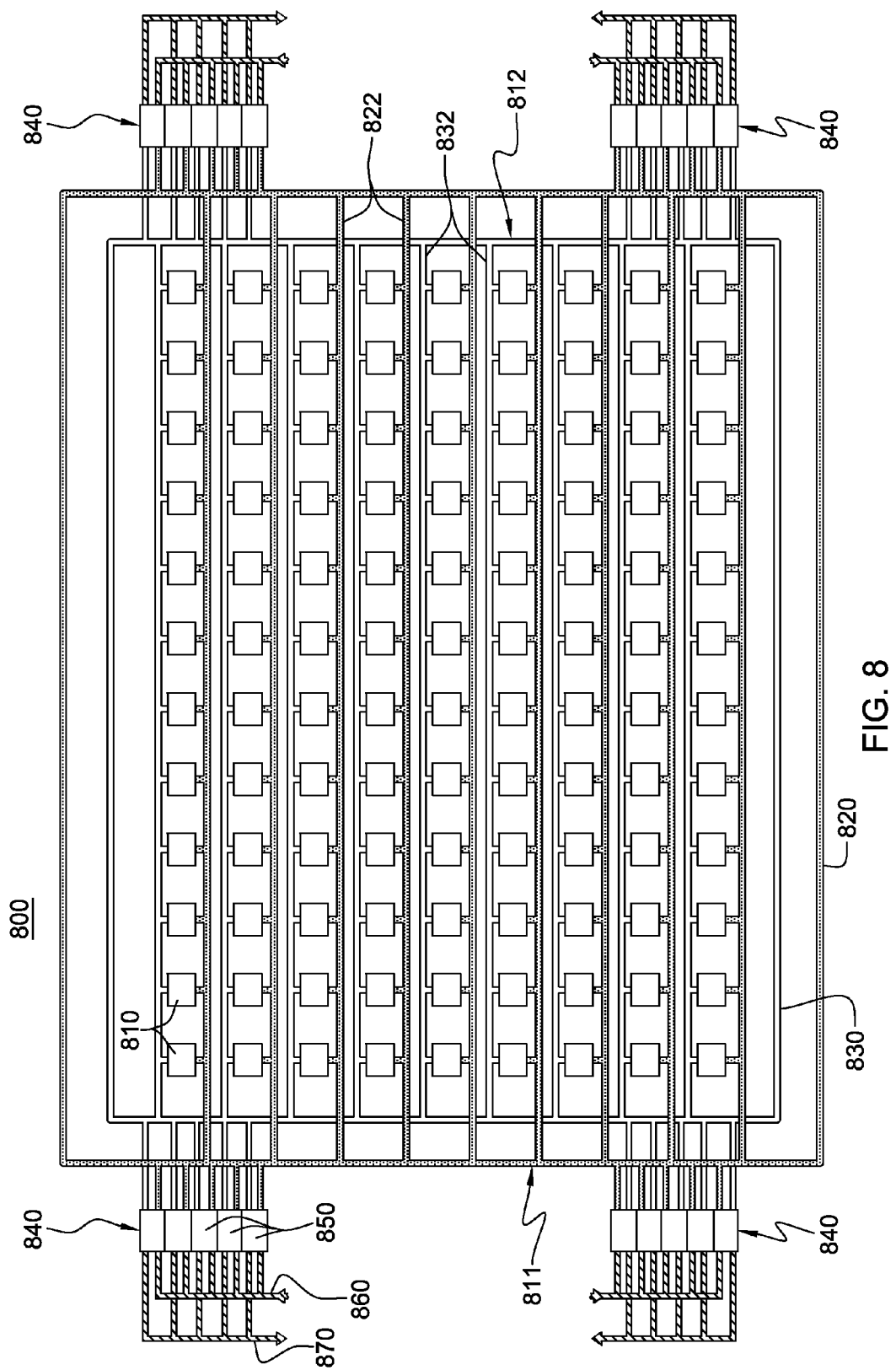
FIG. 8 is a schematic of another embodiment of a cooling system for a data center comprising a plurality of liquid-cooled electronics racks, in accordance with an aspect of the present invention.
Figure 9:
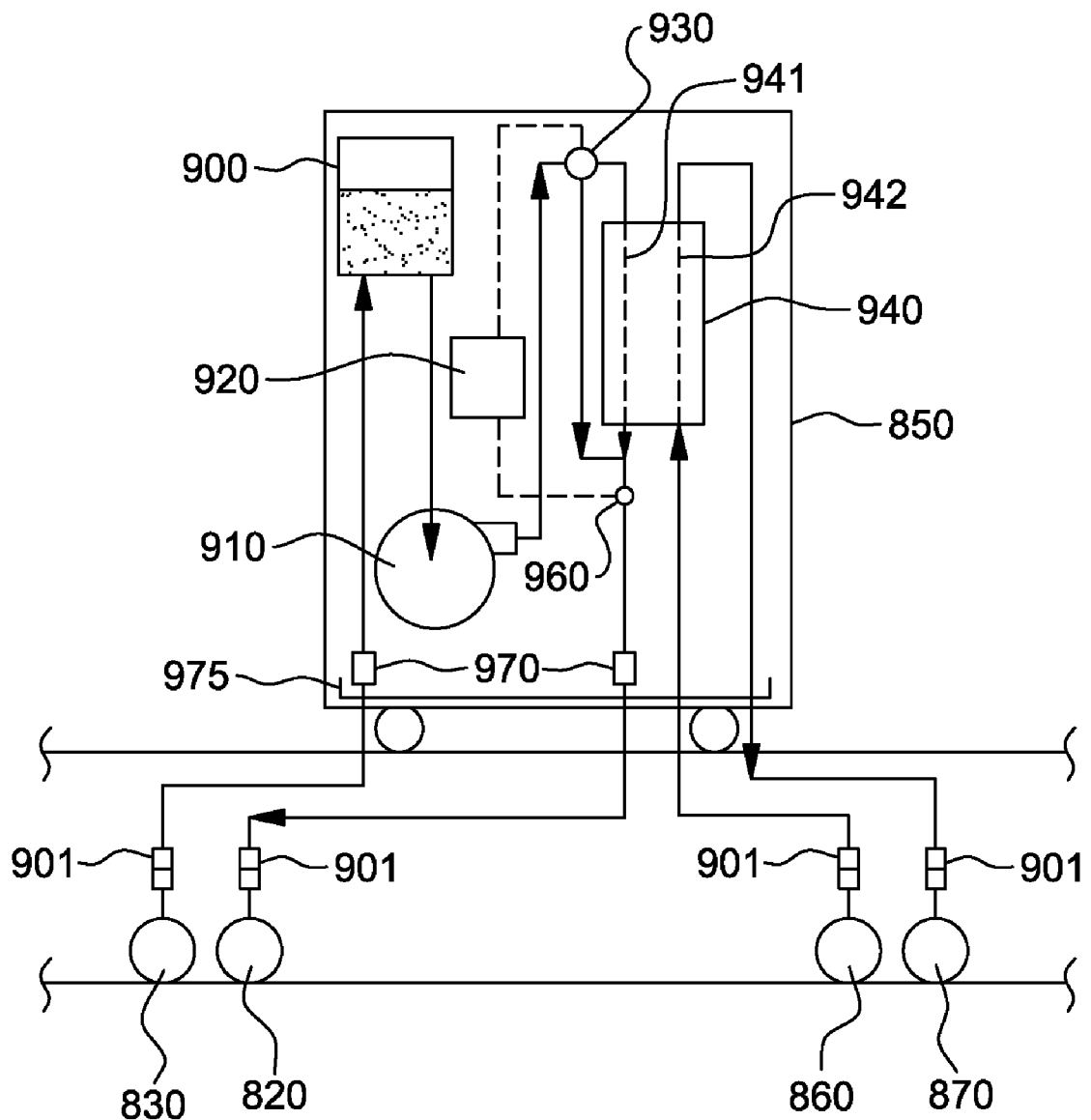
FIG. 9 is a schematic of one embodiment of a modular cooling unit of the plurality of modular cooling units distributed about the main system coolant supply loop and the main system coolant return loop of the cooling system of FIG. 8, in accordance with an aspect of the present invention.
Figure 10:
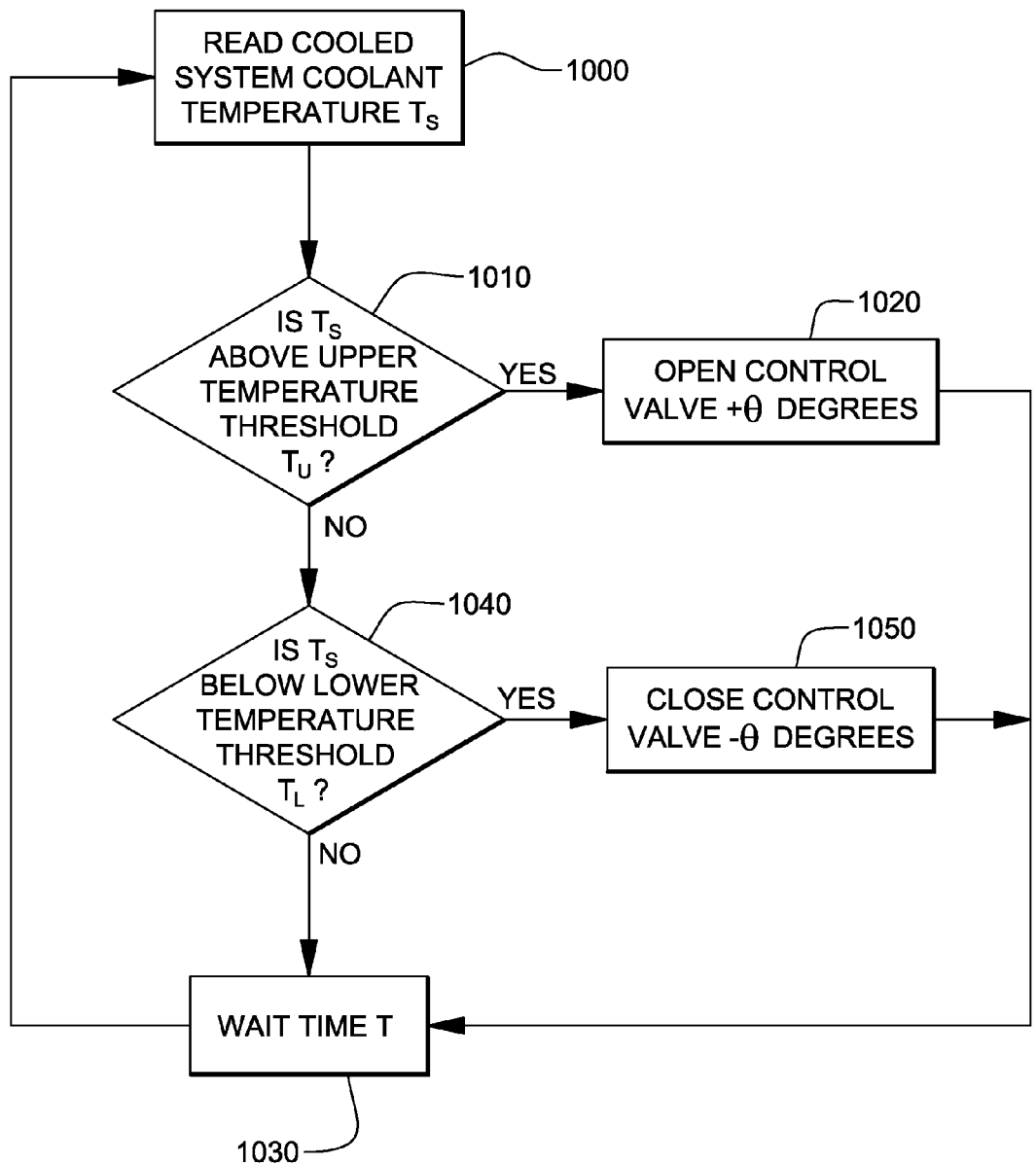
FIG. 10 is a flowchart of one embodiment of logic for controlling temperature of system coolant being provided by the modular cooling unit of FIG. 9 to the main system coolant supply loop of the cooling system of FIG. 8, in accordance with an aspect of the present invention.

Generally stated, therefore, disclosed herein with reference to FIGS. 8-10, is a cooling system which replaces the coolant conditioning units within each electronics rack with multiple, uninterruptible and scalable modular cooling units optimally positioned within the data center to provide a distributed cooling interface between the facility chilled coolant supply (e.g., facility water or refrigerant) and the system coolant circulating through, for example, liquid-cooled cold plates disposed within the electronics racks.

In one embodiment, the modular cooling units described hereinbelow are clustered and distributed about a main system coolant supply loop and a main system coolant return loop of the cooling system for facilitating circulating of cooled system coolant through the electronics racks and rejecting heat load from the exhausted system coolant to the facility coolant. By way of example, each modular cooling unit includes a heat exchanger and pumping module, which facilitates scalability of the cooling system in terms of system coolant flow rate and heat load capacity.

FIG. 8 depicts one embodiment of a data center 800 comprising a plurality of liquid-cooled electronics racks 810 aligned in multiple rows and cooled via a cooling system which comprises a system coolant supply manifold 811 and a system coolant return manifold 812, as well as multiple clusters 840 of modular cooling units 850. System coolant supply manifold 811 includes a main system coolant supply loop 820, which (in the embodiment illustrated) encircles an area within which the rows of electronics racks are disposed, and a plurality of system coolant supply branch lines 822 extending from main system coolant supply loop 820 and in fluid communication therewith at multiple locations. Specifically, in the embodiment illustrated, each system coolant supply branch line 822 is in fluid communication with main system coolant supply loop 820 at each end thereof (by way of example) to better facilitate supply of cooled system coolant to the plurality of liquid-cooled electronics racks 810. When operational, cooled system coolant circulates through the main system coolant supply loop 820, and enters a system coolant supply branch line 822 at either end thereof before flowing to the one or more liquid-cooled electronics racks in fluid communication with that system coolant supply branch line 822. In an alternate configuration, one or more auxiliary coolant flow lines (not shown) might be in fluid communication with one or more of the lines making up the main system coolant supply loop and/or one or more of the system coolant supply branch lines 822 extending therefrom. For example, an auxiliary coolant flow line could be in fluid communication at its ends with the main system coolant supply loop and be disposed transverse to the system coolant supply branch lines 822 depicted in FIG. 8. Note that similar auxiliary coolant flow lines could be provided in association with the system coolant return manifold components described below as well.

The system coolant return manifold 812 comprises a main system coolant return loop 830 and a plurality of system coolant return branch lines 832 which, as shown, are in fluid communication at each end with main system coolant return loop 830. The plurality of system coolant return branch lines 832 are also in fluid communication with the plurality of liquid-cooled electronics racks 810 for facilitating recirculation of exhausted system coolant from the plurality of liquid-cooled electronics racks 810 through modular cooling units 850 to main system coolant supply loop 820. When operational, exhausted system coolant circulates through the main system coolant return loop 830. In the embodiment illustrated, main system coolant return loop 830 is disposed about the perimeter of the plurality of liquid-cooled electronics racks of the data center 800, i.e., the main system coolant return loop encircles an area within which the rows of electronics racks are disposed. As noted above, one or more auxiliary coolant flow lines (not shown) could be in fluid communication with one or more of the lines making up the main system coolant return loop 830 and/or one or more of the system coolant return branch lines 832 extending therefrom, as desired for a particular cooling system implementation.

As shown, multiple clusters 840 of modular cooling units 850 are disposed about data center 800 in fluid communication with main system coolant supply loop 820 and main system coolant return loop 830. These clusters 840 of modular cooling units 850 are optimally distributed about the perimeter of the electronics racks in fluid communication with the main system coolant supply and return loops, each of which has a ring-like configuration. Placement of the clusters of modular cooling units at each corner of the supply and return loops (that is, in each quadrant of the loops) results in a reduction in the average coolant flow path length to the electronics racks, thereby facilitating reduction in the pressure drop through the closed loop path. This allows for the use of smaller diameter pipes for the branch lines, which in one embodiment, reduces congestion in the under-floor space housing these lines. Also, as noted, although connections for the main system coolant supply loop and main system coolant return loop to the respective branch lines are shown near the locations of the clusters 840 of modular cooling units 850, it should be appreciated that additional, auxiliary coolant flow line connections may be made along the lines of the main system coolant supply and return loops at the top and bottom of the ring-shaped configurations, and between or to the individual branch lines supplying coolant to or exhausting coolant from the array of electronics racks. Note that the clusters of modular cooling units act in concert, so the loss of a single modular cooling unit (or even an entire cluster of modular cooling units) will not cause a cooling interruption to the data center operation. Also, since only controlled system coolant (e.g., conditioned water) is circulating within the electronics racks, the coolant quality cleanliness requirements placed on the customer's facility coolant do not need to be as stringent.

As explained further below, each modular cooling unit includes a liquid-to-liquid heat exchanger which comprises a first coolant path and a second coolant path. The first coolant path is in fluid communication with the main system coolant return loop and the main system coolant supply loop to facilitate passing a portion of exhausted system coolant from the main system coolant return loop through the heat exchanger for cooling and subsequent output thereof to the main system coolant supply loop as cooled system coolant. The second coolant path is coupled in fluid communication with a facility coolant supply line 860 and a facility coolant return line 870 to facilitate passing chilled facility coolant through the heat exchanger for cooling exhausted system coolant passing through the first coolant loop of the heat exchanger.

FIG. 9 depicts one embodiment of a modular cooling unit 850 disposed on a raised floor of a data center. In this embodiment, main system coolant supply loop 820, main system coolant return loop 830, facility coolant supply line 860 and facility coolant return line 870 are depicted beneath the raised floor. The modular cooling unit 850 connects to the supply and return loops, and the facility coolant supply and return lines via respective quick connect couplings 901. By way of example, quick connect couplings 901 may comprise any one of various types of commercially available couplings, such as those available from Colder Products Company, of St. Paul, Minn., U.S.A., or Parker Hannifin, of Cleveland, Ohio, U.S.A.

A portion of the exhausted system coolant flowing through main system coolant return loop 830 is drawn into modular cooling unit 850 into a reservoir (e.g., expansion tank) 900 in fluid communication with a coolant pump 910. Coolant pump 910 feeds coolant to a liquid-to-liquid heat exchanger 940 via a flow control valve 930. Flow control valve 930 is a proportional control flow mixing valve, which allows for control of the amount of exhausted system coolant flowing through first coolant path 941 of liquid-to-liquid heat exchanger 940 based on a sensed temperature ($T_S$) provided by temperature sensor 960 at the output of liquid-to-liquid heat exchanger 940. A controller 920 is in communication with temperature sensor 960 and flow control valve 930 to monitor temperature of the cooled system coolant and to control the amount of system coolant passing through first coolant path 941 of liquid-to-liquid heat exchanger 940 (and thereby passing around the first coolant path 941 of liquid-to-liquid heat exchanger 940, as shown). Facility coolant flow through the second coolant path 942 of liquid-to-liquid heat exchanger 940 is established via connections to facility coolant supply line 860 and facility coolant return line 870, as shown. Electrically actuated flow shut-off valves 970 are disposed at the inlet and outlet lines of modular cooling unit 850 for automated shut off of coolant flow through the cooling unit when, for example, there is a pump or heat exchanger failure. A leak detection pan 975 is also provided within modular cooling unit 850 to facilitate detection of a coolant leak within the cooling unit.

In one embodiment, multiple modular cooling units 850 are coupled together to form a cluster of modular cooling units, such as illustrated in FIG. 8. Although not shown in FIGS. 8 & 9, a power and control sub-frame may be mounted at the end of each cluster of modular cooling units to power and monitor the functions of each heat exchanger and pumping component within the modular cooling units of the cluster. The temperature of the system coolant supplied by each modular cooling unit is controlled by monitoring the temperature of system coolant leaving the heat exchanger and using the difference between the temperature monitored and one or more set point supply temperatures to provide a feedback signal which adjusts the flow control valve controlling the percentage of system coolant flowing through (or around) the liquid-to-liquid heat exchanger.

FIG. 10 depicts one flowchart of controller logic for controlling the temperature of cooled system coolant being supplied by the modular cooling unit to the main system coolant supply loop. The cooled system coolant temperature $T_S$ is ascertained 1000, and a determination is made whether temperature $T_S$ is above an upper temperature threshold $T_U$ 1010. If "yes", then the flow control valve within the modular cooling unit is opened by a preset amount (i.e., +θ°) 1020. Once the control valve has been adjusted, logic waits a time interval T 1030, before again ascertaining the cooled system coolant temperature $T_S$ departing the modular cooling unit 1000. If temperature $T_S$ is below the upper temperature threshold $T_U$, then a determination is made whether temperature $T_S$ is below a lower temperature threshold $T_L$ 1040. If "yes", then the flow control valve within the modular cooling unit is closed by a preset amount, (for example, −θ°) 1050, after which the logic waits time interval T 1030 before again ascertaining the temperature $T_S$ of cooled system coolant 1000 being output from the modular cooling unit.

Further details and variations of liquid-based cooling apparatuses and methods for cooling electronics systems and/or electronics racks are disclosed in co-filed U.S. patent application Ser. No. 12/556,019, published Mar. 10, 2011, as U.S. Patent Publication No. 2011/0058637A1, entitled "Pressure Control Unit and Method Facilitating Single-Phase Heat Transfer in a Cooling System", and co-filed U.S. patent application Ser. No. 12/556,031, published Mar. 10, 2011, as U.S. Patent Publication No. 2011/0056225A1, entitled "Control of System Coolant to Facilitate Two-Phase Heat Transfer in a Multi-Evaporator Cooling System", and co-filed U.S. patent application Ser. No. 12/556,066, published Mar. 10, 2011, as U.S. Patent Publication No. 2011/0060470A1, entitled "Cooling System and Method Minimizing Power Consumption in Cooling Liquid-Cooled Electronics Racks", and co-filed U.S. patent application Ser. No. 12/556,040, published Mar. 10, 2011, as U.S. Patent Publication No. 2011/0056675A1, entitled "Apparatus and Method for Adjusting Coolant Flow Resistance Through Liquid-Cooled Electronics Rack(s)", the entirety of each of which is hereby incorporated herein by reference.

As will be appreciated by one skilled in the art, aspects of the controller described above may be embodied as a system, method or computer program product. Accordingly, aspects of the controller may take the form of an entirely hardware embodiment, an entirely software embodiment (including firmware, resident software, micro-code, etc.) or an embodiment combining software and hardware aspects that may all generally be referred to herein as a "circuit", "module" or "system". Furthermore, aspects of the controller may take the form of a computer program product embodied in one or more computer readable medium(s) having computer readable program code embodied thereon.

Any combination of one or more computer readable medium(s) may be utilized. The computer readable medium may be a computer readable storage medium. A computer readable storage medium may be, for example, but not limited to, an electronic, magnetic, optical, or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer-readable signal medium may include a propagated data signal with computer-readable program code embodied therein, for example, in baseband or as part of a carrier wave. Such a propagated signal may take any of a variety of forms, including, but not limited to, electromagnetic, optical, or any suitable combination thereof. A computer-readable signal medium may be any computer-readable medium that is not a computer-readable storage medium and that can communicate, propagate, or transport a program for use by or in connection with an instruction execution system, apparatus or device.

Program code embodied on a computer readable medium may be transmitted using an appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language, such as Java, Smalltalk, C++ or the like, and conventional procedural programming languages, such as the "C" programming language or similar programming languages.

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowcharts or block diagrams may represent a module, segment, or portion of code, which comprises one or more executable instructions for implementing the specified logical function(s). It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Although embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A cooling system comprising:
   a system coolant supply manifold, the system coolant supply manifold comprising a main system coolant supply loop and at least one system coolant supply branch line coupled to and in fluid communication with a first portion of the main system coolant supply loop at a first end of the at least one system coolant supply branch line and a second portion of the main system coolant supply loop at a second end of the at least one system coolant supply branch line for facilitating supply of cooled system coolant to a plurality of liquid-cooled electronics racks, wherein cooled system coolant circulates through the main system coolant supply loop;

a system coolant return manifold, the system coolant return manifold comprising a main system coolant return loop and at least one system coolant return branch line coupled to and in fluid communication with a first portion of the main system coolant return loop at a first end of the at least one system coolant return branch line and with a second portion of the main system coolant return loop at a second end of the at least one system coolant return branch line for facilitating return of exhausted system coolant from the plurality of liquid-cooled electronics racks, wherein exhausted system coolant circulates through the main system coolant return loop; and a plurality of modular cooling units each coupled in fluid communication with the main system coolant supply loop and the main system coolant return loop, and each modular cooling unit comprising a liquid-to-liquid heat exchanger comprising a first coolant path and a second coolant path, wherein the first coolant path is in fluid communication with the main system coolant return loop and the main system coolant supply loop to facilitate passing a portion of exhausted system coolant from the main system coolant return loop through the liquid-to-liquid heat exchanger, and the second coolant path is coupled in fluid communication with a facility coolant supply line and a facility coolant return line to facilitate passing chilled facility coolant through the liquid-to-liquid heat exchanger for cooling exhausted system coolant passing through the first coolant path of the liquid-to-liquid heat exchanger for recirculation thereof to the plurality of liquid-cooled electronics racks as cooled system coolant via the main system coolant supply loop.

2. The cooling system of claim 1, wherein modular cooling units of the plurality of modular cooling units are in fluid communication with the main system coolant supply loop and the main system coolant return loop at multiple connect locations disposed about the main system coolant supply loop and the main system coolant return loop.

3. The cooling system of claim 2, wherein at least two modular cooling units of the plurality of modular cooling units are clustered at one or more connect locations of the multiple connect locations disposed about the main system coolant supply loop and the main system coolant return loop.

4. The cooling system of claim 1, wherein the system coolant supply manifold, the plurality of liquid-cooled electronics racks, the system coolant return manifold and the plurality of modular cooling units define a closed loop system coolant flow path wherein heat extracted from the plurality of liquid-cooled electronics racks is exhausted to facility coolant passing through the liquid-to-liquid heat exchangers of the plurality of modular cooling units.

5. The cooling system of claim 1, wherein the main system coolant supply loop and the main system coolant return loop each encircle an area within which at least some liquid-cooled electronics racks of the plurality of liquid-cooled electronics racks align.

6. The cooling system of claim 1, wherein the main system coolant supply loop and the main system coolant return loop each encircle an area within which the plurality of liquid-cooled electronics racks are disposed.

7. The cooling system of claim 1, wherein each modular cooling unit further comprises at least one flow control valve in fluid communication with the first coolant path of the liquid-to-liquid heat exchanger thereof, and wherein each modular cooling unit further comprises a controller coupled to the at least one flow control valve for directing at least a portion of exhausted system coolant passing through the modular cooling unit through the first coolant path of the liquid-to-liquid heat exchanger.

8. The cooling system of claim 7, wherein each modular cooling unit further comprises a temperature sensor disposed to sense temperature of cooled system coolant being supplied by the modular cooling unit to the main system coolant supply loop, the controller being coupled to the temperature sensor for allowing the controller to ascertain, and control via the at least one flow control valve, temperature of the cooled system coolant being supplied by the modular cooling unit to the main system coolant supply loop.

9. The cooling system of claim 1, wherein each modular cooling unit further comprises a reservoir and a pump coupled in fluid communication with the main system coolant return loop for receiving a portion of exhausted system coolant from the main system coolant return loop and pumping at least a portion of the exhausted system coolant through the first coolant path of the liquid-to-liquid heat exchanger, wherein the plurality of modular cooling units are distributed about the main system coolant supply loop and the main system coolant return loop to provide distributed pumping and cooling of system coolant into the main system coolant supply loop.

10. A data center comprising:

a plurality of liquid-cooled electronics racks; and a cooling system for facilitating liquid-cooling of the plurality of liquid-cooled electronics racks, the cooling system comprising:

a system coolant supply manifold, the system coolant supply manifold comprising a main system coolant supply loop and a plurality of system coolant supply branch lines coupled to and in fluid communication with the main system coolant supply loop for facilitating supply of cooled system coolant to the plurality of liquid-cooled electronics racks, wherein cooled system coolant circulates through the main system coolant supply loop, and at least one system coolant supply branch line of the plurality of system coolant supply branch lines is coupled to and in fluid communication with a first portion of the main system coolant supply loop at a first end of the at least one system coolant supply branch line and with a second portion of the main system coolant supply loop at a second end of the at least one system coolant supply branch line;

a system coolant return manifold, the system coolant return manifold comprising a main system coolant return loop and a plurality of system coolant return branch lines coupled to and in fluid communication with the main system coolant return loop for facilitating return of exhausted system coolant from the plurality of liquid-cooled electronics racks, wherein exhausted system coolant circulates through the main system coolant return loop, and at least one system coolant return branch line of the plurality of system coolant return branch lines is coupled to and in fluid communication with a first portion of the main system coolant return loop at a first end of the at least one system coolant return branch line and with a second portion of the main system coolant return loop at a second end of the at least one system coolant return branch line; and a plurality of modular cooling units each coupled in fluid communication with the main system coolant supply loop and the main system coolant return loop, and each modular cooling unit comprising a liquid-to-liquid heat exchanger comprising a first coolant path and a second coolant path, wherein the first coolant path is in fluid communication with the main system coolant return loop and the main system coolant supply loop to facilitate passing a portion of exhausted system coolant from the main system coolant return loop through the liquid-to-liquid heat exchanger, and the second coolant path is coupled in fluid communication with a facility coolant supply line and a facility coolant return line to facilitate passing chilled facility coolant through the liquid-to-liquid heat exchanger for cooling exhausted system coolant passing through the first coolant path of the liquid-to-liquid heat exchanger for recirculation thereof to the plurality of liquid-cooled electronics racks as cooled system coolant via the main system coolant supply loop.

11. The data center of claim 10, wherein the main system coolant supply loop and the main system coolant return loop each encircle an area within which at least some liquid-cooled electronics racks of the plurality of liquid-cooled electronics racks align.

12. The data center of claim 10, wherein the main system coolant supply loop and the main system coolant return loop each encircle an area within which the plurality of liquid-cooled electronics racks are disposed.

13. The data center of claim 10, wherein modular cooling units of the plurality of modular cooling units are in fluid communication with the main system coolant supply loop and the main system coolant return loop at multiple connect locations disposed about the main system coolant supply loop and the main system coolant return loop.

14. The data center of claim 13, wherein at least two modular cooling units of the plurality of modular cooling units are clustered at one or more connect locations of the multiple connect locations disposed about the main system coolant supply loop and the main system coolant return loop.

15. The data center of claim 14, wherein clusters of at least two modular cooling units are disposed in different quadrants of the main system coolant supply loop and the main system coolant return loop.

16. The data center of claim 10, wherein each modular cooling unit of the plurality of modular cooling units comprises at least one flow control valve in fluid communication with the first coolant path of the liquid-to-liquid heat exchanger, and wherein each modular cooling unit further comprises a controller coupled to the at least one flow control valve for directing at least a portion of exhausted system coolant passing through the modular cooling unit through the first coolant path of the liquid-to-liquid heat exchanger, and each modular cooling unit further comprises a temperature sensor disposed to sense temperature of cooled system coolant being supplied by the modular cooling unit to the main system coolant supply loop, the controller being coupled to the temperature sensor to ascertain, and control via the at least one flow control valve, temperature of the cooled system coolant being supplied by the modular cooling unit to the main system coolant supply loop, and wherein each modular coolant unit further comprises a reservoir and a pump coupled in fluid communication with the main system coolant return loop for receiving a portion of exhausted system coolant from the main system coolant return loop and pumping at least a portion of the exhausted system coolant through the first coolant path of the liquid-to-liquid heat exchanger, wherein the plurality of modular cooling units are distributed about the main system coolant supply loop and the main system coolant return loop to provide distributed cooling and pumping of system coolant into the main system coolant supply loop.

17. A method of facilitating parallel cooling of a plurality of liquid-cooled electronics racks, the method comprising:

providing a system coolant supply manifold, the system coolant supply manifold comprising a main system coolant supply loop and at least one system coolant supply branch line coupled to and in fluid communication with a first portion of the main system coolant supply loop at a first end of the at least one system coolant supply branch line and with a second portion of the main system coolant supply loop at a second end of the at least one system coolant supply branch line for facilitating supply of cooled system coolant to the plurality of liquid-cooled electronics racks, wherein cooled system coolant circulates through the main system coolant supply loop;

providing a system coolant return manifold, the system coolant return manifold comprising a main system coolant return loop and at least one system coolant return branch line coupled to and in fluid communication with a first portion of the the main system coolant return loop at a first end of the at least one system coolant return branch line and with a second portion of the main system coolant return loop at a second end of the at least one system coolant return branch line for facilitating return of exhausted system coolant from the plurality of liquid-cooled electronics racks, wherein exhausted system coolant circulates through the main system coolant return loop; and providing a plurality of modular cooling units coupled in fluid communication with the main system coolant supply loop and the main system coolant return loop, and each modular cooling unit comprising a liquid-to-liquid heat exchanger comprising a first coolant path and a second coolant path, wherein the first coolant path is in fluid communication with the main system coolant return loop and the main system coolant supply loop to facilitate passing a portion of exhausted system coolant from the main system coolant return loop through the liquid-to-liquid heat exchanger, and the second coolant path is coupled in fluid communication with a facility coolant supply line and a facility coolant return line to facilitate passing chilled facility coolant through the liquid-to-liquid heat exchanger for cooling exhausted system coolant passing through the first coolant path of the liquid-to-liquid heat exchanger for recirculation thereof to the plurality of liquid-cooled electronics racks as cooled system coolant via the main system coolant supply loop.

18. The cooling system of claim 1, wherein there are more liquid-cooled electronics racks in the plurality of liquid-cooled electronics racks than modular cooling units in the plurality of modular cooling units supplying system coolant to the main system coolant supply loop.

* * * * *